(12) United States Patent
Maruhashi et al.

(10) Patent No.: US 6,674,347 B1
(45) Date of Patent: Jan. 6, 2004

(54) MULTI-LAYER SUBSTRATE SUPPRESSING AN UNWANTED TRANSMISSION MODE

(75) Inventors: Kenichi Maruhashi, Tokyo (JP); Masaharu Ito, Tokyo (JP); Keiichi Ohata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/533,683

(22) Filed: Mar. 23, 2000

(30) Foreign Application Priority Data

Mar. 23, 1999 (JP) .......................................... 11-078720

(51) Int. Cl.[7] .............................................. H01P 3/08
(52) U.S. Cl. ...................... 333/238; 333/161; 333/246
(58) Field of Search ................... 333/161, 246, 333/238

(56) References Cited

U.S. PATENT DOCUMENTS

| | | | |
|---|---|---|---|
| 5,481,232 A | * | 1/1996 | Wu et al. ..................... 333/161 |
| 5,694,134 A | * | 12/1997 | Barnes ................. 343/700 MS |

FOREIGN PATENT DOCUMENTS

| | | |
|---|---|---|
| JP | SHO 63-238701 | 10/1988 |
| JP | HEI 2-87701 | 3/1990 |
| JP | 9-167825 | 6/1997 |
| JP | HEI 9-307318 | 11/1997 |
| JP | HEI 10-107514 | 4/1998 |
| JP | 10163711 | * 6/1998 ................. 333/247 |

OTHER PUBLICATIONS

T. Hirose, et al., "A Flip–Chip MMIC Design with CPW Technology in the W–Band", 1998 IEEE MTT–S Digest, pp. 525–528.
H. Shigesawa, et al., "Conductor–Backed Slot Line and Coplanar Waveguide: Dangers and Full–Wave Analyses", 1988 IEEE MTT–S Digest, pp. 199–202.
M. Haneishi, "Modern Planar Antenna", p. 63, Mar. 25, 1993.
N. Das, "Methods and Suppression or Avoidance of Parallel–Plate Power Leakage from Conductor–Backed Transmission Lines", 1996 IEEE, pp. 169–181.

* cited by examiner

*Primary Examiner*—Robert Pascal
*Assistant Examiner*—Kimberly E Glenn
(74) *Attorney, Agent, or Firm*—Choate, Hall & Stewart

(57) ABSTRACT

A multi-layer substrate comprises a first dielectric layer, a coplanar waveguide line formed on a first surface of the first dielectric layer, the coplanar waveguide line including a signal conductor and a pair of ground conductor layers positioned at opposite sides of the signal conductor, separately from the signal conductor, and a second dielectric layer formed to cover the coplanar waveguide line and the first dielectric layer and having an opening positioned at least on the signal conductor of the coplanar waveguide line. A thickness of the first dielectric layer is smaller than the value of $c/\{4f \cdot (\epsilon_1 - 1)^{1/2}\}$, where c is velocity of light, f is a frequency of a signal propagating in the signal line, and $\epsilon_1$ is a dielectric constant of the first dielectric layer.

25 Claims, 10 Drawing Sheets

MULTI-LAYER SUBSTRATE SUPPRESSING AN UNWANTED TRANSMISSION MODE

BACKGROUND OF THE INVENTION

The present invention relates to a multi-layer substrate used in a millimeter wave band and a microwave band, and more specifically to a multi-layer substrate configured to suppress an unwanted propagation mode.

In the prior art, a composite microwave integrated circuit having a number of semiconductor devices mounted on a multi-layer substrate is known, which was disclosed in Japanese Patent Application Pre-examination Publication No. JP-A-09-167825. In the circuit disclosed in this patent publication, a plurality of semiconductor devices are accommodated in a cavity formed in a dielectric substrate, so as to avoid influence of an external electromagnetic field and to ensure an airtight condition. Each of the semiconductor devices are connected to microstrip lines.

In addition, T. Hirose et al, "A FLIP-CHIP MMIC DESIGN WITH CPW TECHNOLOGY IN THE W-BAND", IEEE MTT-S, International Microwave Symposium Digest, pp.525–528, 1998 (the content of which is incorporated by reference in its entirety into this application) discloses a high frequency circuit including a coplanar waveguide formed on a single-layer substrate as an interconnection line. In a coplanar waveguide line, a signal line and a ground line are formed in the same plane, and the coplanar waveguide line is suitable to a flip chip bonding which can make connection with a low inductance and good repeatability.

When the coplanar waveguide line is used, however, a leakage of a signal wave in an unwanted propagation mode within the substrate has become a problem. This problem of leakage is described in detail in H. Shigesawa et al, "CONDUCTOR-BACKED SLOT LINE AND COPLANAR WAVEGUIDE: DANGERS AND FULL-WAVE ANALYSES", IEEE MTT-S, International Microwave Symposium Digest, pp.199–202, 1988 (the content of which is incorporated by reference in its entirety into this application). The leakage mode includes a surface wave mode occurring when a ground conductor is formed on only one surface of a dielectric plate (as the ground conductor constituting the coplanar waveguide line) and a parallel-plate mode occurring when a ground conductor is formed on each of opposite surfaces of the dielectric plate (as the ground conductor constituting the coplanar waveguide line, and a ground conductor formed on a back surface of the dielectric plate). The leakage in these modes increases a transmission loss in the coplanar waveguide line, and causes interference between adjacent lines in the substrate, between adjacent devices in the substrate, and/or between adjacent line and device in the substrate.

Under the above mentioned circumstances, various approaches for suppressing the unwanted modes in the case that the coplanar waveguide line is formed in a single-layer substrate or in a multi-layer substrate, have been proposed.

A method for suppressing the surface wave mode is described in, for example, Misao HANEISHI, "Modern Planar Antenna", Kabushiki Kaisha Sogou Gijutsu Center, Page 63. In this literature, it was designed so that the following equation (1) holds:

$$t < c / \{4f \cdot (\epsilon_r - 1)_{e,fra\ 1/2}\} \quad (1)$$

where t is a thickness of a dielectric substrate c is velocity of light f is an operating frequency $\epsilon_r$ is a dielectric constant of a dielectric substrate material Alternatively, a method for suppressing the parallel-plate mode is described in, for example, N. K. Das, "Methods of Suppression or 1 0 Avoidance of Parallel-Plate Power Leakage from Conductor-Backed Transmission Lines", IEEE TRANSACTIONS ON MICROWAVE THEORY AND TECHNIQUES, VOL. 44, NO. 2, pp. 169–181, FEBRUARY 1996 (the content of which is incorporated by reference in its entirety into this application). Specifically, there are a method for interconnecting, by means of a via contact, between a ground conductor of a coplanar waveguide line and a back surface ground electrode which are formed on opposite surfaces of a dielectric substrate, respectively, and another method for forming a coplanar waveguide line on a double-layer substrate consisting of two layers having different dielectric constants.

However, a problem occurring when the coplanar waveguide line is formed on an internal layer within a multi-layer substrate, cannot be dissolved with only the above mentioned methods.

Here, referring to FIG. 18A, there is shown a diagrammatic plan view of a prior art multi-layer substrate in which the coplanar waveguide line is formed. FIG. 18B is a sectional view taken along the line H—H in FIG. 18A. The prior art multi-layer substrate is generally designated with the reference number 101, and includes a signal line 107 is selectively formed on a surface of a first dielectric layer 103, and a pair of ground conductor layers 108 formed on opposite sides of the signal line 107, separately from the signal line 107, the signal line 107 and the ground conductor layers 108 being formed from the same conductor layer 104. Thus, a coplanar waveguide line 102 is formed. Furthermore, a second dielectric layer 105 is formed on the coplanar waveguide line 102 to cover the signal line 107 and the ground conductor layers 108.

In order to suppress the surface wave mode in the multi-layer substrate of this structure, the thickness of each of the first and second dielectric layers 103 and 105 must be smaller than the value of "t" obtained from the equation (1). Therefore, in order to use a high signal frequency, it is necessary to make the thickness of the dielectric layers as thin as possible. Accordingly, a problem occurs in which the number of layers cannot be increased because of the limited thickness of the dielectric layer, even if it is desired to increase the number of layers in the multi-layer substrate. On the other hand, since the thickness of the overall multi-layer substrate becomes thin, it becomes short of a mechanical strength.

Furthermore, various problems have been encountered in a prior art multi-layer high frequency circuit substrate intended to suppress the parallel-plate mode. Referring to FIG. 19A, there is shown a diagrammatic plan view of a prior art multi-layer substrate intended to suppress the parallel-plate mode. FIG. 19B is a sectional view taken along the line I—I in FIG. 19A.

The prior art multi-layer substrate intended to suppress the parallel-plate mode, is designated with the reference number 111, and includes a signal line 117 is selectively formed on a surface of a first dielectric layer 113, and a pair of ground conductor layers 118 formed on opposite sides of the signal line 117, separately from the signal line 117, the signal line 117 and the ground conductor layers 118 being formed from the same conductor layer 114. Thus, a coplanar waveguide line 112 is formed. Furthermore, a second dielectric layer 115 is formed on the coplanar waveguide line 112 to cover the signal line 117 and the ground conductor layers 118. Ground conductor layers 119 are formed on a back surface of the first dielectric layer 113 and a front surface of the second dielectric layer 115, respectively. Furthermore, via contacts 121 are formed to penetrate through each of the first and second dielectric layers 113 and 115, in order to interconnect between the ground conductors 118 and the ground conductor layers 119. Incidentally, the via contacts 121 are located along an extending direction of the coplanar waveguide line at intervals which is at least not longer than a half of a signal wavelength.

With this arrangement, a structure equivalent to a section of a hollow-pipe waveguide is formed by the via contact 121 and the ground conductor layers 119. In this waveguide structure, however, since it is assumed that a medium having a dielectric constant higher than that of air is used, a propagation in an unwanted waveguide mode occurs at a frequency lower than that at which a waveguide mode occurs in the hollow-pipe waveguide. Considering that for example an alumina substrate having the dielectric constant of 10 is used, an interval of the via contacts is 1.3 mm, and a spacing between the ground conductor layers is 0.65 mm, a signal having a frequency of not less than 40 GHz propagates in the waveguide mode. Accordingly, in order to realize a desired signal transmission in the coplanar waveguide line in a high frequency region, it is necessary to lower the dielectric constant or to reduce the interval of the via contacts and the spacing between the ground conductor layers.

In adjustment of these factors, however, restriction is involved in a performance of a required substrate material, a forming process, a fabricating cost, a yield of production, etc., with the result that attainment is not easy in some high frequency region.

BRIEF SUMMARY OF THE INVENTION

Accordingly, it is an object of the present invention to provide a multi-layer substrate having a coplanar waveguide line, which has overcome the above mentioned problem of the conventional prior art.

Another object of the present invention is to provide a multi-layer substrate having a coplanar waveguide line, which is configured to suppress an unwanted propagation mode in a high frequency band, and which can be easily fabricated and has a satisfactory mechanical strength.

The above and other objects of the present invention are achieved in accordance with the present invention by a multi-layer substrate comprising a first dielectric layer, a coplanar waveguide line formed on a first surface of the first dielectric layer, and a second dielectric layer formed on the first dielectric layer and having an opening positioned at least on a signal conductor of the coplanar waveguide line.

According to another aspect of the present invention, there is provided a multi-layer substrate comprising a first dielectric layer, a coplanar waveguide line formed on a first surface of the first dielectric layer, and a second dielectric layer formed on the first dielectric layer and having a groove positioned in a region at least in conformity with a signal conductor of the coplanar waveguide line.

With the above mentioned arrangement, since the second dielectric layer formed on the first dielectric layer has the opening or the groove positioned in the region in conformity with the signal conductor of the coplanar waveguide line, an unwanted propagation mode including the surface wave mode is suppressed. On the other hand, since the thickness of the whole is not limited, a satisfactory mechanical strength can be ensured.

In the multi-layer substrate in accordance with the present invention, it is preferred that a thickness of the second dielectric layer between a bottom of the groove and the first dielectric layer is smaller than the value of $c/\{4f \cdot (\in_2 - 1)^{1/2}\}$, where c is velocity of light, f is a frequency of a signal propagating in the coplanar waveguide line, and $\in_2$ is a dielectric constant of the second dielectric layer.

In addition, it is also preferred that a thickness of the first dielectric layer is smaller than the value of $c/\{4f \cdot (\in_1 - 1)^{1/2}\}$, where c is velocity of light, f is a frequency of a signal propagating in the coplanar waveguide line, and $\in_1$ is a dielectric constant of the first dielectric layer.

Furthermore, a dielectric material having a dielectric constant lower than that of the second dielectric layer, is preferably filled in the groove.

Moreover, a second groove is preferably formed on a second surface of the first dielectric layer, in a region at least in conformity with the signal conductor of the coplanar waveguide line.

In this variation, it is preferred that a thickness of the first dielectric layer between a bottom of the second groove and the signal conductor is smaller than the value of $c/\{4f \cdot (\in_1 - 1)^{1/2}\}$, where c is velocity of light, f is a frequency of a signal propagating in the coplanar waveguide line, and $\in_1$ is a dielectric constant of the first dielectric layer.

In this variation, furthermore, a second dielectric material having a dielectric constant lower than that of the first dielectric layer is preferably filled in the second groove.

In another variation, a back ground conductor layer can be formed on a second surface of the first dielectric layer.

In this variation, a via contact can be buried in the first dielectric layer to connect between the back ground conductor layer and a ground conductor of the coplanar waveguide line.

Furthermore, it is preferred that the dielectric constant of the first dielectric layer is smaller than that of the second dielectric layer.

In addition, a conductor layer can be formed on the second dielectric layer.

Moreover, a feed-through can be formed to bridge between a pair of second dielectric layer portions, which are positioned on a pair of ground conductors of the coplanar waveguide line, respectively.

In this case, the conductor layer formed on the second dielectric layer can extend onto the feed-through.

Furthermore, the multi-layer substrate can include a connecting means for connecting the conductor layer and the pair of ground conductors of the coplanar waveguide line.

The above and other objects, features and advantages of the present invention will be apparent from the following description of preferred embodiments of the invention with reference to the accompanying drawings.

DETAILED DESCRIPTION OF THE INVENTION

Now, embodiments of the multi-layer substrate in accordance with the present invention will be described with reference to the accompanying drawings.

First Embodiment

Figure 1A:
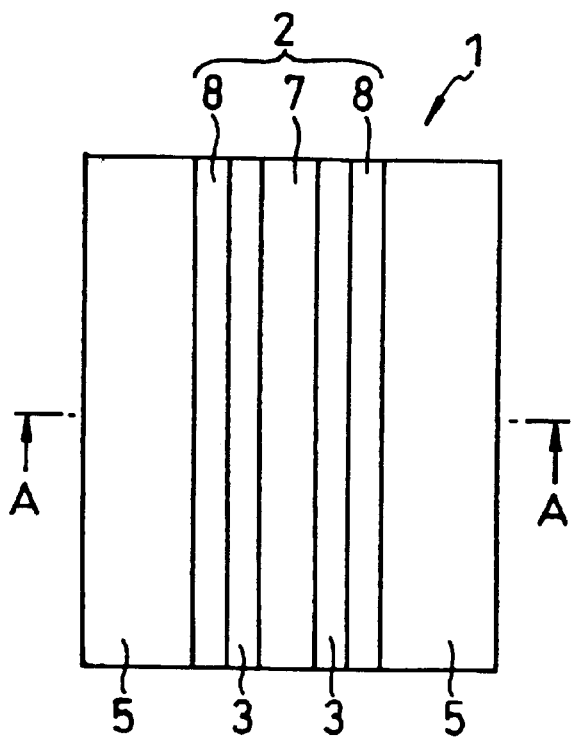
FIG. 1A is a diagrammatic plan view of a first embodiment of the multi-layer substrate in accordance with the present invention.
Figure 1B:
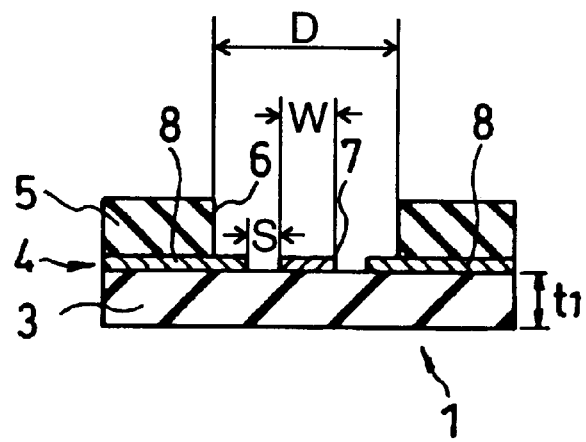
FIG. 1B is a diagrammatic sectional view taken along the line A—A in FIG. 1A.

Referring to FIG. 1A, there is shown a diagrammatic plan view of a first embodiment of the multi-layer substrate in accordance with the present invention. FIG. 1B is a diagrammatic sectional view taken along the line A—A in FIG. 1A.

The first embodiment of the multi-layer substrate is generally designated with the reference number 1, and includes a patterned conductor layer 4 which is formed on a first surface of a first dielectric layer 3 to form a signal conductor 7 and a pair of ground conductor layers 8 positioned at opposite sides of the signal conductor 7, separately from the signal conductor 7. A coplanar waveguide line 2 is constituted of the signal conductor 7 and the ground conductor layers 8 thus formed on the first dielectric layer 3.

Furthermore, a second dielectric layer 5 is formed to cover the patterned conductor layer 4 and is formed to have an opening 6 at a region including the signal conductor 7 and an inside peripheral portion of each ground conductor layer 8 near to the signal conductor 7. Namely, in the section shown in FIG. 1B, the whole of the signal conductor 7 and only the inside peripheral portion of each ground conductor layer 8 are exposed in the opening 6.

In this embodiment, the first dielectric layer 3 is formed to have a thickness $t_1$ which meets with the following equation (2):

$$t_1 < c/\{4f(\epsilon_1-1)^{1/2}\} \quad (2)$$

where c is velocity of light;

f is a frequency of a signal propagating in the signal line; and $\epsilon^1$ is a dielectric constant of the first dielectric layer 3.

On the other hand, the thickness of the second dielectric layer 5 is not restrained at all for suppression of a leakage mode.

In this embodiment constructed as mentioned above, a surface wave mode may exist in a region formed of the ground conductor layer 8 and the second dielectric layer 5. However, since the opening 6 is formed, a coupling between a propagation mode of the coplanar waveguide line 2 and the surface wave mode is effectively suppressed, with the result that the leakage of the signal propagating in the coplanar waveguide line 2 is sufficiently suppressed.

In the first embodiment, when the multi-layer substrate 1 is formed of ceramic as a basic material, the multi-layer substrate 1 can be easily formed by laminating a first green sheet printed with a patterned conductor paste (which becomes the patterned conductor layer 4) and a second green sheet in which a portion corresponding to the opening 6 is cut out, and sintering the integrally laminated first and second green sheets.

In this first embodiment, the coplanar waveguide line 2 sufficiently suppressing the leakage of the signal transmission can be easily realized in the multi-layer high frequency circuit substrate 1. On the other hand, since it is not necessary to thin the second dielectric layer 5 in order to suppress the leakage mode, the whole of the multi-layer high frequency circuit substrate 1 can ensure a sufficient mechanical strength. This mechanical strength is not substantially lost by the opening 6 formed in the second dielectric layer 5.

A size of the opening 6 in a section orthogonal to a signal propagating direction (namely, the width "D" of the opening 6 shown in the sectional view of FIG. 1B) is preferred to be sufficiently large. Specifically, assuming that a width of the signal conductor 7 is "W" and a spacing between the signal conductor 7 and each ground conductor layer 8 is "S," the size "D" of the opening 6 is preferred to be not smaller than {W+4S}. For example, in the coplanar waveguide line 2 having W of 110 μm and S of 70 μm, when the multi-layer substrate is formed to have the opening 6 of the size D of 500 μm, the leakage of the signal transmission in the unwanted mode could be suppressed to a practically negligible degree.

In the case that the multi-layer high frequency circuit substrate 1 of the first embodiment is mounted in an outer casing, it is necessary to avoid a signal leakage attributable to a parallel-plate mode in a region formed by the outer casing, the first dielectric layer 3 and the ground conductor layer 8. In this case, accordingly, it is desirable to insert a spacer so as to create a gap between the outer casing and the first dielectric layer 3.

Second Embodiment

Figure 2:
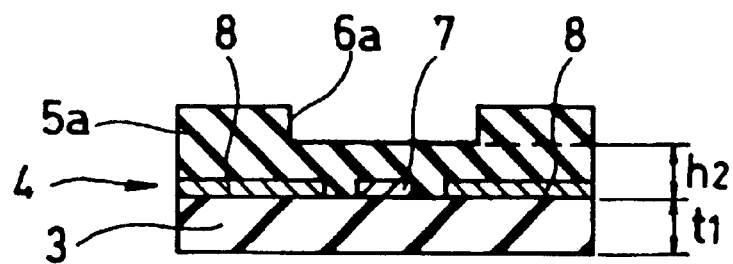
FIG. 2 is a diagrammatic sectional view of a second embodiment of the multi-layer substrate in accordance with the present invention.

Referring to FIG. 2, there is shown a diagrammatic sectional view similar to FIG. 1B but illustrating a second embodiment of the multi-layer substrate in accordance with the present invention. In FIG. 2, elements corresponding to those shown in FIG. 1B are given the same reference numbers and explanation will be omitted.

In this second embodiment, the second dielectric layer is designated with the reference number 5a, and has a groove 6a in place of the opening 6 in the first embodiment, so that the second dielectric layer is partially thinned in the groove. This groove 6a is formed at a region including the signal conductor 7 and an inside peripheral portion of each ground conductor layer 8 near to the signal conductor 7, similarly to the opening 6 in the first embodiment.

In this second embodiment, the second dielectric layer 5a is so formed that a thickness $h_2$ between a bottom of the groove 6a and the first dielectric layer 3 meets with the following equation (3):

$$h_2 < c/\{4f(\in_2 -1)^{1/2}\} \quad (3)$$

where c is velocity of light;

f is a frequency of a signal propagating in the signal line; and $\in_2$ is a dielectric constant of the second dielectric layer 5a.

On the other hand, the thickness of the second dielectric layer 5 in the other region is not restrained at all for suppression of a leakage mode.

In this second embodiment constructed as mentioned above, since the groove 6a is formed in the second dielectric layer 5a and the thickness of the second dielectric layer 5a in a region of the groove 6a is appropriately defined, the leakage of the signal propagating in the coplanar waveguide line 2 can be sufficiently suppressed, similarly to the first embodiment.

In the case that the multi-layer substrate 1 of the second embodiment is formed of ceramic as a basic material, the multi-layer substrate 1 can be easily formed by laminating a first green sheet printed with a patterned conductor paste (which becomes the patterned conductor layer 4), a second green sheet having a thickness of less than $h_2$, and a third green sheet in which a portion corresponding to the groove 6a is cut out, in the name order, and sintering the integrally laminated first, second and third green sheets.

Even in this second embodiment, the coplanar waveguide line 2 sufficiently suppressing the leakage of the signal transmission can be easily realized in the multi-layer high frequency circuit substrate 1. On the other hand, since it is not necessary to thin the whole of the second dielectric layer 5a in order to suppress the leakage mode, the whole of the multi-layer high frequency circuit substrate 1 can ensure a sufficient mechanical strength. In addition, since the coplanar waveguide line 2 is not exposed, the conductor layer 4 constituting the coplanar waveguide line 2 is protected by the dielectric layer 5a.

Similarly to the first embodiment, a size of the groove 6a in a section orthogonal to a signal propagating direction (namely, the width of the groove 6a shown in the sectional view of FIG. 2) is preferred to be sufficiently large. Specifically, assuming that a width of the signal conductor 7 is "W" and a spacing between the signal conductor 7 and each ground conductor layer 8 is "S," the size of the groove 6a is preferred to be not smaller than {W+4S}.

In the case that the multi-layer high frequency circuit substrate 1 of the second embodiment is mounted in an outer casing, it is desirable to insert a spacer so as to create a gap between the outer casing and the first dielectric layer 3.

Third Embodiment

Figure 3:
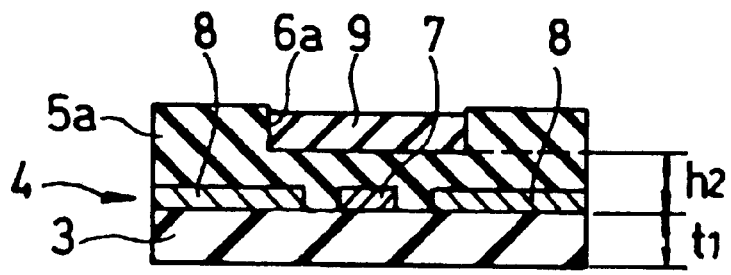
FIG. 3 is a diagrammatic sectional view of a third embodiment of the multi-layer substrate in accordance with the present invention.

Referring to FIG. 3, there is shown a diagrammatic sectional view similar to FIG. 2 but illustrating a third embodiment of the multi-layer substrate in accordance with the present invention. In FIG. 3, elements corresponding to those shown in FIG. 2 are given the same reference numbers and explanation will be omitted.

In this third embodiment, a low dielectric constant material 9, for example, an organic resin such as a benzochlorobutene (abbreviated to "BCB"), having a dielectric constant lower than that of the first and second dielectric layers 3 and 5a, is filled in the groove 6a.

In this third embodiment constructed as mentioned above, similarly to the second embodiment, since the groove is formed in the second dielectric layer and the thickness of the second dielectric layer in a region of the groove 6a is appropriately defined, the leakage of the signal propagating in the coplanar waveguide line can be sufficiently suppressed. In addition, even in this third embodiment, the coplanar waveguide line sufficiently suppressing the leakage of the signal transmission can be easily realized in the multi-layer high frequency circuit substrate. On the other hand, since it is not necessary to thin the whole of the second dielectric layer in order to suppress the leakage mode, and since the low dielectric constant material 9 is filled in the groove 6a, the whole of the multi-layer high frequency circuit substrate 1 can ensure a more sufficient mechanical strength. In addition, similarly to the second embodiment, since the coplanar waveguide line is not exposed, the conductor layer 4 constituting the coplanar waveguide line is protected by the dielectric layer.

Similarly to the second embodiment, the size of the groove 6a in a section orthogonal to a signal propagating direction is preferred to be sufficiently large. Specifically, assuming that a width of the signal conductor 7 is "W" and a spacing between the signal conductor 7 and each ground conductor layer 8 is "S," the size of the groove 6a is preferred to be not smaller than {W+4S }.

In the case that the multi-layer high frequency circuit substrate 1 of the third embodiment is mounted in an outer casing, it is desirable to insert a spacer so as to create a gap between the outer casing and the first dielectric layer 3.

Fourth Embodiment

Figure 4:
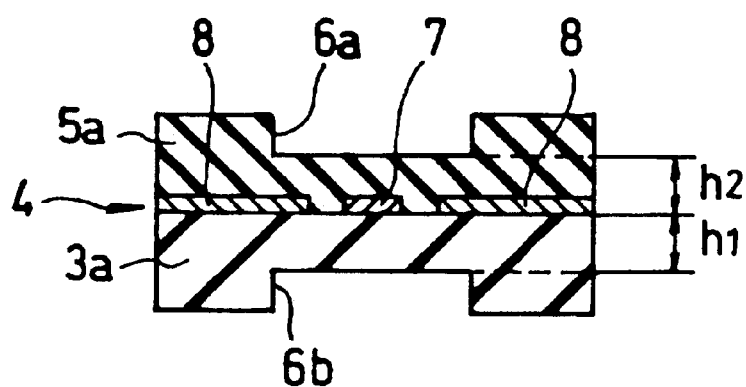
FIG. 4 is a diagrammatic sectional view of a fourth embodiment of the multi-layer substrate in accordance with the present invention.

Referring to FIG. 4, there is shown a diagrammatic sectional view similar to FIG. 2 but illustrating a fourth embodiment of the multi-layer substrate in accordance with the present invention. In FIG. 4, elements corresponding to those shown in FIG. 2 are given the same reference numbers and explanation will be omitted.

In this fourth embodiment, the first dielectric layer, designated with the reference number 3a, has a groove 6b on a back surface thereof at a region including the signal conductor 7 and an inside peripheral portion of each ground conductor layer 8 near to the signal conductor 7, similarly to the groove 6a formed in the second dielectric layer.

In this fourth embodiment, the first dielectric layer 3a is so formed that a thickness $h_1$ between a bottom of the groove 6b and the first signal conductor 7 meets with the following equation (4):

$$h_1 < c/\{4f \cdot (\in_1 - 1)_{1/2}\} \quad (4)$$

where c is velocity of light;
 f is a frequency of a signal propagating in the signal line; and
 $\in_1$ is a dielectric constant of the first dielectric layer 3a.

On the other hand, the thickness of the first dielectric layer 3a in the other region is not restrained at all for suppression of a leakage mode.

In this fourth embodiment constructed as mentioned above, since the groove 6b is formed in the first dielectric layer 3a and the thickness of the first dielectric layer 3a in a region of the groove 6b is appropriately defined, the leakage of the signal propagating in the coplanar waveguide line 2 can be sufficiently suppressed, similarly to the second embodiment.

In the case that the multi-layer substrate 1 of the fourth embodiment is formed of ceramic as a basic material, the multi-layer substrate 1 can be easily formed by laminating a first green sheet in which a portion corresponding to the groove 6b is cut out, a second green sheet printed with a patterned conductor paste (which becomes the patterned conductor layer 4) and having a thickness of less than $h_1$, a third green sheet having a thickness of less than $h_2$, and a fourth green sheet in which a portion corresponding to the groove 6a is cut out, in the name order, and sintering the integrally laminated first to fourth green sheets.

Even in this fourth embodiment, the coplanar waveguide line sufficiently suppressing the leakage of the signal transmission can be easily realized in the multi-layer high frequency circuit substrate. On the other hand, since it is not necessary to thin the whole of the first and second dielectric layers 3a and 5a in order to suppress the leakage mode, the whole of the multi-layer high frequency circuit substrate 1 can ensure a sufficient mechanical strength. In addition, in the first to third embodiments, when the multi-layer high frequency circuit substrate 1 is mounted in an outer casing, it was desirable to insert a spacer so as to create a gap between the outer casing and the first dielectric layer 3. In this fourth embodiment, however, since the groove 6b directly under the signal conductor 7 functions as a spacer, it is no longer necessary to independently insert a spacer.

Similarly to the second embodiment, a size of the grooves 6a and 6b in a section orthogonal to a signal propagating direction is preferred to be sufficiently large. Specifically, assuming that a width of the signal conductor 7 is "W" and a spacing between the signal conductor 7 and each ground conductor layer 8 is "S," the size of each groove is preferred to be not smaller than {W+4S}.

Fifth Embodiment

Figure 5:
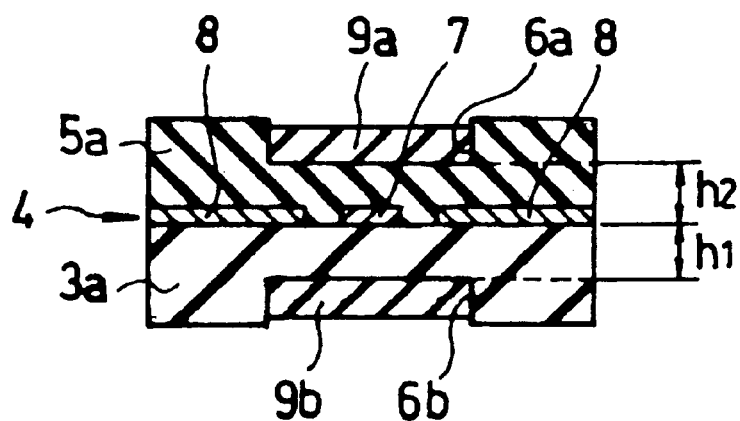
FIG. 5 is a diagrammatic sectional view of a fifth embodiment of the multi-layer substrate in accordance with the present invention.

Referring to FIG. 5, there is shown a diagrammatic sectional view similar to FIG. 4 but illustrating a fifth embodiment of the multi-layer substrate in accordance with the present invention. In FIG. 5, elements corresponding to those shown in FIG. 4 are given the same reference numbers and explanation will be omitted.

In this fifth embodiment, low dielectric constant materials 9a and 9b, for example, an organic resin such as BCB, having a dielectric constant lower than that of the first and second dielectric layers 3a and 5a, are filled in the grooves 6a and 6b, respectively.

In this fifth embodiment constructed as mentioned above, since the grooves 6a and 6b are formed in the first and second dielectric layers 3a and 5a and the thickness of each dielectric layer in a region of the groove is appropriately defined, the leakage of the signal propagating in the coplanar waveguide line can be sufficiently suppressed, similarly to the fourth embodiment.

In the case that the multi-layer substrate 1 of the fifth embodiment is formed of ceramic as a basic material, the multi-layer substrate 1 can be easily formed by laminating a first green sheet in which a portion corresponding to the groove 6b is cut out, a second green sheet printed with a patterned conductor paste (which becomes the patterned conductor layer 4) and having a thickness of less than $h_1$, a third green sheet having a thickness of less than $h_2$, and a fourth green sheet in which a portion corresponding to the groove 6a is cut out, in the name order, and sintering the integrally laminated first to fourth green sheets, and then, filling the low dielectric constant material such as BCB into the two grooves.

Even in this fifth embodiment, the coplanar waveguide line sufficiently suppressing the leakage of the signal transmission can be easily realized in the multi-layer high frequency circuit substrate. On the other hand, since it is not necessary to thin the whole of the first and second dielectric layers 3a and 5a in order to suppress the leakage mode, and since the low dielectric constant materials 9a and 9b are filled in the grooves 6a and 6b, respectively, the whole of the multi-layer high frequency circuit substrate 1 can ensure a more sufficient mechanical strength.

Similarly to the fourth embodiment, a size of the grooves 6a and 6b in a section orthogonal to a signal propagating direction is preferred to be sufficiently large. Specifically, assuming that a width of the signal conductor 7 is "W" and a spacing between the signal conductor 7 and each ground conductor layer 8 is "S," the size of each groove is preferred to be not smaller than {W+4S}.

Sixth Embodiment

Figure 6:
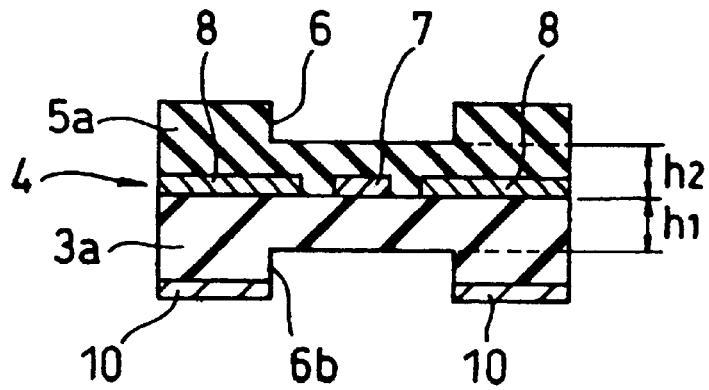
FIG. 6 is a diagrammatic sectional view of a sixth embodiment of the multi-layer substrate in accordance with the present invention.

Referring to FIG. 6, there is shown a diagrammatic sectional view similar to FIG. 4 but illustrating a sixth embodiment of the multi-layer substrate in accordance with the present invention. In FIG. 6, elements corresponding to those shown in FIG. 4 are given the same reference numbers and explanation will be omitted.

In this sixth embodiment, a back ground conductor layer 10 is formed on a back surface of the first dielectric layer 3a, in a region excluding the groove 6b, as shown in FIG. 6. This back ground conductor layer 10 is connected to ground.

In this sixth embodiment, since the grooves 6a and 6b are formed in the first and second dielectric layers 3a and 5a and the thickness of each dielectric layer in a region of the groove is appropriately defined, the leakage of the signal propagating in the coplanar waveguide line can be sufficiently suppressed, similarly to the fourth embodiment.

In the case that the multi-layer substrate 1 of the sixth embodiment is formed of ceramic as a basic material, the multi-layer substrate 1 can be easily formed by laminating a first green sheet in which a portion corresponding to the groove 6b is cut out, and which is printed with a conductor paste (which becomes the back ground conductor layer 10), a second green sheet printed with a patterned conductor paste (which becomes the patterned conductor layer 4) and having a thickness of less than $h_1$, a third green sheet having a thickness of less than $h_2$, and a fourth green sheet in which a portion corresponding to the groove 6a is cut out, in the name order, and sintering the integrally laminated first to fourth green sheets.

Even in this sixth embodiment, the coplanar waveguide line sufficiently suppressing the leakage of the signal transmission can be easily realized in the multi-layer high frequency circuit substrate. On the other hand, since it is not necessary to thin the whole of the first and second dielectric layers 3a and 5a in order to suppress the leakage mode, the whole of the multi-layer high frequency circuit substrate 1 can ensure a sufficient mechanical strength. In addition, in the first to third embodiments, when the multi-layer high frequency circuit substrate 1 is mounted in an outer casing, it was desirable to insert a spacer so as to create a gap between the outer casing and the first dielectric layer. In this sixth embodiment, however, since the groove 6b directly under the signal conductor 7 functions as a spacer, it is no longer necessary to independently insert a spacer, similarly to the fourth embodiment.

Similarly to the fourth embodiment, a size of the grooves 6a and 6b in a section orthogonal to a signal propagating direction is preferred to be sufficiently large. Specifically, assuming that a width of the signal conductor 7 is "W" and a spacing between the signal conductor 7 and each ground conductor layer 8 is "S," the size of each groove is preferred to be not smaller than {W+4S}.

Seventh Embodiment

Figure 7:
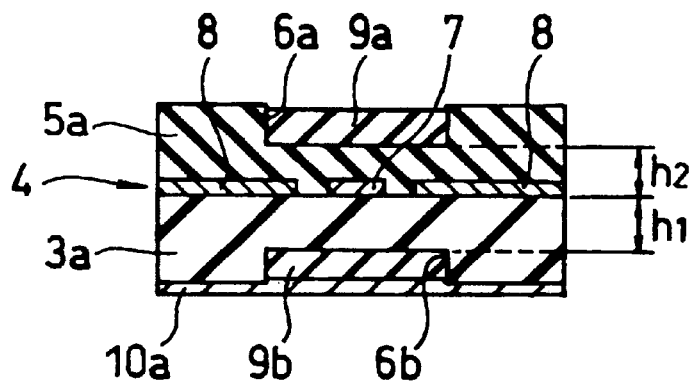
FIG. 7 is a diagrammatic sectional view of a seventh embodiment of the multi-layer substrate in accordance with the present invention.

Referring to FIG. 7, there is shown a diagrammatic sectional view similar to FIG. 5 but illustrating a seventh embodiment of the multi-layer substrate in accordance with the present invention. In FIG. 7, elements corresponding to those shown in FIG. 5 are given the same reference numbers and explanation will be omitted.

In this seventh embodiment, a back ground conductor layer 10a is formed on the whole of a back surface of the first dielectric layer 3a to cover even the low dielectric constant material 9b filled in the groove 6b, as shown in FIG. 7. This back ground conductor layer 10a is connected to ground.

In this seventh embodiment constructed as mentioned above, since the grooves 6a and 6b are formed in the first and second dielectric layers 3a and 5a and the thickness of each dielectric layer in a region of the groove is appropriately defined, the leakage of the signal propagating in the coplanar waveguide line can be sufficiently suppressed, similarly to the fifth embodiment.

In the case that the multi-layer substrate 1 of the seventh embodiment is formed of ceramic as a basic material, the multi-layer substrate 1 can be easily formed by laminating a first green sheet in which a portion corresponding to the groove 6b is cut out, a second green sheet printed with a patterned conductor paste (which becomes the patterned conductor layer 4) and having a thickness of less than $h_1$, a third green sheet having a thickness of less than $h_2$, and a fourth green sheet in which a portion corresponding to the groove 6a is cut out, in the name order, and sintering the integrally laminated first to fourth green sheets, and then, filling the low dielectric constant material such as BCB into the two grooves, and thereafter, forming a metal layer (which becomes the back ground conductor layer 10a) on a back surface of the first dielectric layer.

Even in this seventh embodiment, the coplanar waveguide line sufficiently suppressing the leakage of the signal transmission can be easily realized in the multi-layer high frequency circuit substrate. On the other hand, since it is not necessary to thin the whole of the first and second dielectric layers 3a and 5a in order to suppress the leakage mode, and since the low dielectric constant materials 9a and 9b are filled in the grooves 6a and 6b, respectively, the whole of the multi-layer high frequency circuit substrate 1 can ensure a more sufficient mechanical strength.

In addition, in the first to third embodiments, when the multi-layer high frequency circuit substrate 1 is mounted in an outer casing, it was desirable to insert a spacer so as to create a gap between the outer casing and the first dielectric layer. In this seventh embodiment, however, since the groove 6b directly under the signal conductor 7 functions as a spacer, it is no longer necessary to independently insert a spacer, similarly to the sixth embodiment.

Similarly to the sixth embodiment, a size of the grooves 6a and 6b in a section orthogonal to a signal propagating direction is preferred to be sufficiently large. Specifically, assuming that a width of the signal conductor 7 is "W" and a spacing between the signal conductor 7 and each ground conductor layer 8 is "S," the size of each groove is preferred to be not smaller than { W+4S}.

Eighth Embodiment

Figure 8:
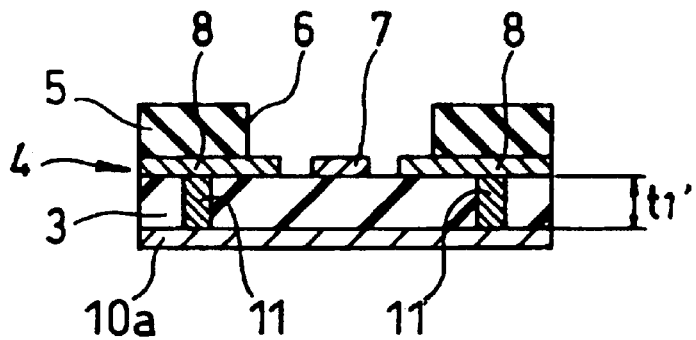
FIG. 8 is a diagrammatic sectional view of an eighth embodiment of the multi-layer substrate in accordance with the present invention.

Referring to FIG. 8, there is shown a diagrammatic sectional view similar to FIG. 1B but illustrating an eighth embodiment of the multilayer substrate in accordance with the present invention. In FIG. 8, elements corresponding to those shown in FIG. 1B are given the same reference numbers and explanation will be omitted.

In this eighth embodiment, a back ground conductor layer 10a is formed on a back surface of the first dielectric layer 3 in the first embodiment. A plurality of via holes are formed in the first dielectric layer 3 for connecting between the back ground conductor layer 10a and each ground conductor layer 8 of the coplanar waveguide line, and each of the via holes is filled up with a conducting material to form a via contact 11, by which each ground conductor layer 8 of the coplanar waveguide line is electrically connected to the back ground conductor layer 10a.

Here, a thickness $t_1'$ of the first dielectric layer 3 is so determined that a cutoff frequency of a quasi hollow-pipe waveguide constituted of the ground conductor layer 8, the back ground conductor layer 10a and the via contact 11, is higher than a signal frequency.

In this eighth embodiment constructed as mentioned above, a surface wave mode may exist in a region formed of the ground conductor layer 8 and the second dielectric layer 5. However, since the opening 6 is formed, a coupling between a propagation mode of the coplanar waveguide line and the surface wave mode is effectively suppressed, with the result that the leakage of the signal propagating in the coplanar waveguide line is sufficiently suppressed.

In the case that the multi-layer substrate 1 of the eighth embodiment is formed of ceramic as a basic material, the multi-layer substrate 1 can be easily formed by laminating a first green sheet having one surface coated with a conductor paste (which becomes the back ground conductor layer 10*a*) and the other surface printed with a patterned conductor paste (which becomes the patterned conductor layer 4). the first green sheet having a plurality of items of buried conductor paste (which become the via contacts 11), and a second green sheet in which a portion corresponding to the opening 6 is cut out, and sintering the integrally laminated first and second green sheets.

Figure 19A:
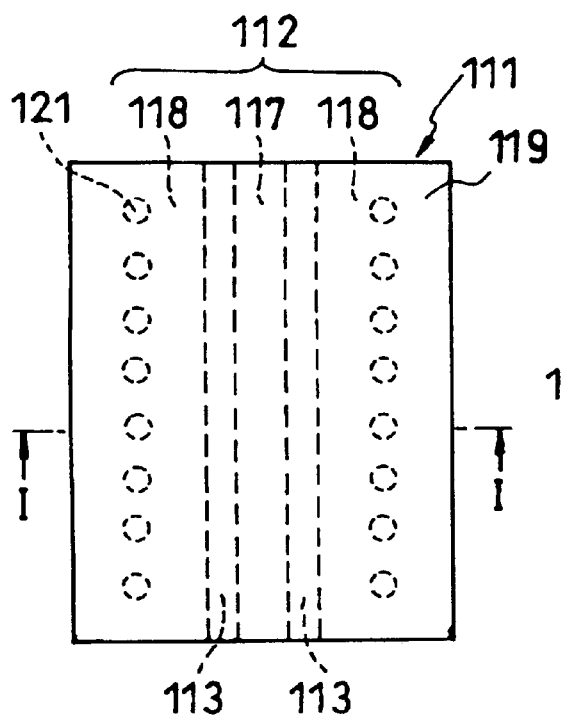
FIG. 19A is a diagrammatic plan view of a prior art multi-layer substrate intended to suppress the parallel-plate mode.
Figure 19B:
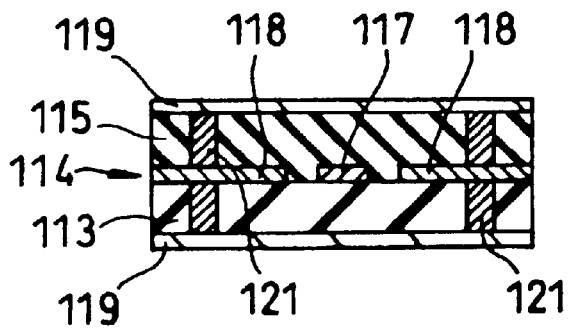
FIG. 19B is a sectional view taken along the line I—I in FIG. 19A.

In this eighth embodiment, the coplanar waveguide line sufficiently suppressing the leakage of the signal transmission can be easily realized in the multi-layer high frequency circuit substrate 1. On the other hand, when the multi-layer high frequency circuit substrate 1 is mounted in an outer casing, it is not necessary to newly insert a spacer Similarly to the prior art example shown in FIGS. 19A and 19B, a structure similar to a hollow-pipe waveguide in section is constituted of the ground conductor layer 8, the back ground conductor layer 10*a* and the via contact 11, as mentioned above. Therefore, the thickness $t_1'$ of the first dielectric layer 3 is subjected to some restraint in order to cut off the propagation mode in the hollow-pipe waveguide. However, since the thickness of the overall multi-layer substrate is in no way limited, a sufficient mechanical strength can be ensured.

Similarly to the first embodiment, a size of the opening 6 in a section orthogonal to a signal propagating direction is preferred to be sufficiently large. Specifically, assuming that a width of the signal conductor 7 is "W" and a spacing between the signal conductor 7 and each ground conductor layer 8 is "S," the size of the opening 6 is preferred to be not smaller than {W+4S}.

Ninth Embodiment

Figure 9:
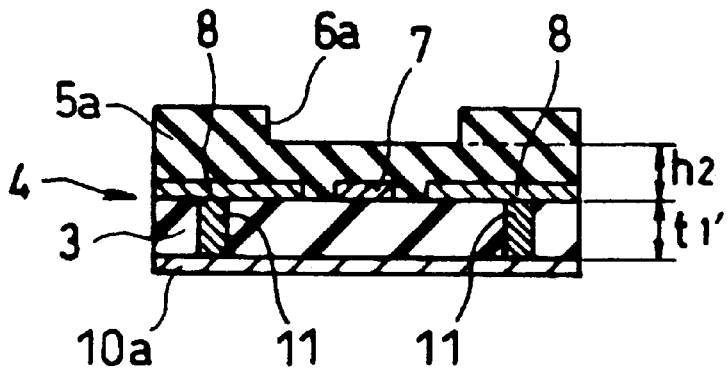
FIG. 9 is a diagrammatic sectional view of a ninth embodiment of the multi-layer substrate in accordance with the present invention.

Referring to FIG. 9, there is shown a diagrammatic sectional view similar to FIG. 2 but illustrating a ninth embodiment of the multi-layer substrate in accordance with the present invention. In FIG. 9, elements corresponding to those shown in FIGS. 2 and 8 are given the same reference numbers and explanation will be omitted.

The second dielectric layer 5*a* has the groove 6*a* at a region including the signal conductor 7 and an inside peripheral portion of each ground conductor layer 8 near to the signal conductor 7.

In this second embodiment, the second dielectric layer 5*a* is so formed that a thickness $h_2$ between a bottom of the groove 6*a* and the first dielectric layer 3 meets with the above mentioned equation (3). In addition, similarly to the eighth embodiment, a back ground conductor layer 10*a* is formed on a back surface of the first dielectric layer 3. A plurality of via holes are formed in the first dielectric layer 3 for connecting between the back ground conductor layer 10*a* and each ground conductor layer 8 of the coplanar waveguide line, and each of the via holes is filled up with a conducting material to form a via contact 11, by which each ground conductor layer 8 of the coplanar waveguide line is electrically connected to the back ground conductor layer 10*a*. The thickness $t_1'$ of the first dielectric layer 3 is so determined that a cutoff frequency of a quasi hollow-pipe waveguide constituted of the ground conductor layer 8, the back ground conductor layer 10*a* and the via contact 11, is higher than a signal frequency.

In this ninth embodiment constructed as mentioned above, similarly to the eighth embodiment, a surface wave mode may exist in a region formed of the ground conductor layer 8 and the second dielectric layer 5. However, since the groove 6*a* is formed, a coupling between a propagation mode of the coplanar waveguide line and the surface wave mode is effectively suppressed, with the result that the leakage of the signal propagating in the coplanar waveguide line is sufficiently suppressed.

In the case that the multi-layer substrate 1 of the ninth embodiment is formed of ceramic as a basic material, the multi-layer substrate 1 can be easily formed by laminating a first green sheet having one surface coated with a conductor paste (which becomes the back ground conductor layer 10*a*) and the other surface printed with a patterned conductor paste (which becomes the patterned conductor layer 4), the first green sheet having a plurality of items of buried conductor paste (which become the via contacts 11), a second green sheet having a thickness of less than $h_2$, and a third green sheet in which a portion corresponding to the groove 6*a* is cut out, in the name order, and sintering the integrally laminated first, second and third green sheets.

In this ninth embodiment, the coplanar waveguide line sufficiently suppressing the leakage of the signal transmission can be easily realized in the multi-layer high frequency circuit substrate 1. On the other hand, when the multi-layer high frequency circuit substrate 1 is mounted in an outer casing, it is not necessary to newly insert a spacer Similarly to the eighth embodiment, the thickness $t_1'$ of the first dielectric layer 3 is subjected to some restraint in order to cut off the propagation mode in the hollow-pipe waveguide, but, since the thickness of the overall multi-layer substrate is in no way limited, a sufficient mechanical strength can be ensured. In addition, since the coplanar waveguide line 2 is not exposed, the conductor layer 4 constituting the coplanar waveguide line 2 is protected by the dielectric layer.

Similarly to the second embodiment, a size of the groove 6*a* in a section orthogonal to a signal propagating direction is preferred to be sufficiently large. Specifically, assuming that a width of the signal conductor 7 is "W" and a spacing between the signal conductor 7 and each ground conductor layer 8 is "S," the size of the groove 6*a* is preferred to be not smaller than {W+4S}.

Tenth Embodiment

Figure 10:
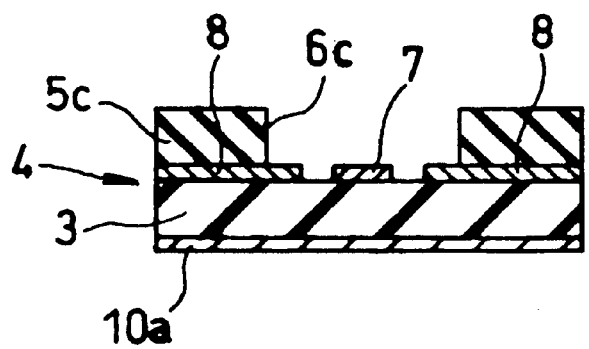
FIG. 10 is a diagrammatic sectional view of a tenth embodiment of the multi-layer substrate in accordance with the present invention.

Referring to FIG. 10, there is shown a diagrammatic sectional view similar to FIG. 1B but illustrating a tenth embodiment of the multi-layer substrate in accordance with the present invention. In FIG. 10, elements corresponding to those shown in FIG. 1B are given the same reference numbers and explanation will be omitted.

In this tenth embodiment, a second dielectric layer 5*c* is formed to cover the patterned conductor layer 4 and is formed to have an opening 6*c* at a region including the signal conductor 7 and an inside peripheral portion of each ground conductor layer 8 near to the signal conductor 7. The first dielectric layer 3 is formed of a material having a dielectric constant smaller than that of the second dielectric layer 5*c*. On the other hand, the thickness of the second dielectric layer 5*c* is in no way limited.

In this tenth embodiment, furthermore, a back ground conductor layer 10*a* is formed on the whole of a back surface of the first dielectric layer 3.

In this tenth embodiment constructed as mentioned above, a surface wave mode may exist in a region formed of the ground conductor layer 8 and the second dielectric layer 5*c*. However, since the opening 6*c* is formed, a coupling between a propagation mode of the coplanar waveguide line and the surface wave mode is effectively suppressed, with the result that the leakage of the signal propagating in the coplanar waveguide line is sufficiently suppressed. Furthermore, since the dielectric constant of the first dielectric layer 3 is smaller than that of the second dielectric layer 5c, a parallel-plate mode which would occur between the ground conductor layer 8 and the back ground conductor layer 10a, is suppressed.

When the multi-layer substrate 1 of this tenth embodiment is formed of ceramic as a basic material, the multi-layer substrate 1 can be easily formed by laminating a low dielectric constant substrate having one surface formed with the coplanar waveguide line and the other surface coated with the back ground conductor layer 10a, and a second green sheet in which a portion corresponding to the opening 6 is cut out, and sintering the integrally laminated sheets.

Even in this tenth embodiment, the coplanar waveguide line sufficiently suppressing the leakage of the signal transmission can be easily realized in the multi-layer high frequency circuit substrate. On the other hand, since it is not necessary to thin the whole of the second dielectric layer 5c in order to suppress the leakage mode, the whole of the multi-layer high frequency circuit substrate 1 can ensure a sufficient mechanical strength. This mechanical strength is not substantially lost by the opening 6c formed in the second dielectric layer 5c.

Furthermore, similarly to the first embodiment, a size of the opening 6c in a section orthogonal to a signal propagating direction s preferred to be sufficiently large. Specifically, assuming that a width of the signal conductor 7 is "W" and a spacing between the signal conductor 7 and each ground conductor layer 8 is "S," the size of the opening 6 is preferred to be not smaller than {W+4S}.

Eleventh Embodiment

Figure 11:
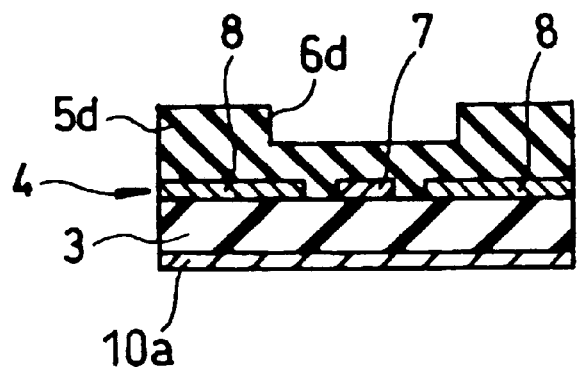
FIG. 11 is a diagrammatic sectional view of an eleventh embodiment of the multi-layer substrate in accordance with the present invention.

Referring to FIG. 11, there is shown a diagrammatic sectional view similar to FIG. 1B but illustrating an eleventh embodiment of the multilayer substrate in accordance with the present invention. In FIG. 11, elements corresponding to those shown in FIG. 1B are given the same reference numbers and explanation will be omitted.

In this eleventh embodiment, a second dielectric layer 5d has a groove 6d at a region including the signal conductor 7 and an inside peripheral portion of each ground conductor layer 8 near to the signal conductor 7. The first dielectric layer 3 is formed of a material having a dielectric constant smaller than that of the second dielectric layer 5d. On the other hand, the thickness of the second dielectric layer 5d is in no way limited.

In this eleventh embodiment constructed as mentioned above, similarly to the tenth embodiment, a surface wave mode may exist in a region formed of the ground conductor layer 8 and the second dielectric layer 5c. However, since the groove 6d is formed, a coupling between a propagation mode of the coplanar waveguide line and the surface wave mode is effectively suppressed, with the result that the leakage of the signal propagating in the coplanar waveguide line is sufficiently suppressed. Furthermore, since the dielectric constant of the first dielectric layer 3 is smaller than that of the second dielectric layer 5d, a parallel-plate mode which would occur between the ground conductor layer 8 and the back ground conductor layer 10a, is suppressed.

When the multi-layer substrate 1 of this eleventh embodiment is formed of ceramic as a basic material, the multi-layer substrate 1 can be easily formed by laminating a low dielectric constant substrate having one surface formed with the coplanar waveguide line and the other surface coated with the back ground conductor layer 10a, and a second green sheet having a groove structure, formed in a separate step, and sintering the integrally laminated sheets.

Even in this eleventh embodiment, similarly to the tenth embodiment, the coplanar waveguide line sufficiently suppressing the leakage of the signal transmission can be easily realized in the multi-layer high frequency circuit substrate. On the other hand. since it is not necessary to thin the whole of the second dielectric layer 5d in order to suppress the leakage mode, the whole of the multi-layer high frequency circuit substrate 1 can ensure a sufficient mechanical strength. This mechanical strength is not substantially lost by the groove 6d formed in the second dielectric layer 5d. In addition, since the coplanar waveguide line is not exposed, the conductor layer 4 constituting the coplanar waveguide line is protected by the dielectric layer.

Furthermore, similarly to the second embodiment, a size of the groove 6d in a section orthogonal to a signal propagating direction s preferred to be sufficiently large. Specifically, assuming that a width of the signal conductor 7 is "W" and a spacing between the signal conductor 7 and each ground conductor layer 8 is "S," the size of the groove 6d is preferred to be not smaller than {W+4S}.

Twelfth Embodiment

Figure 12A:
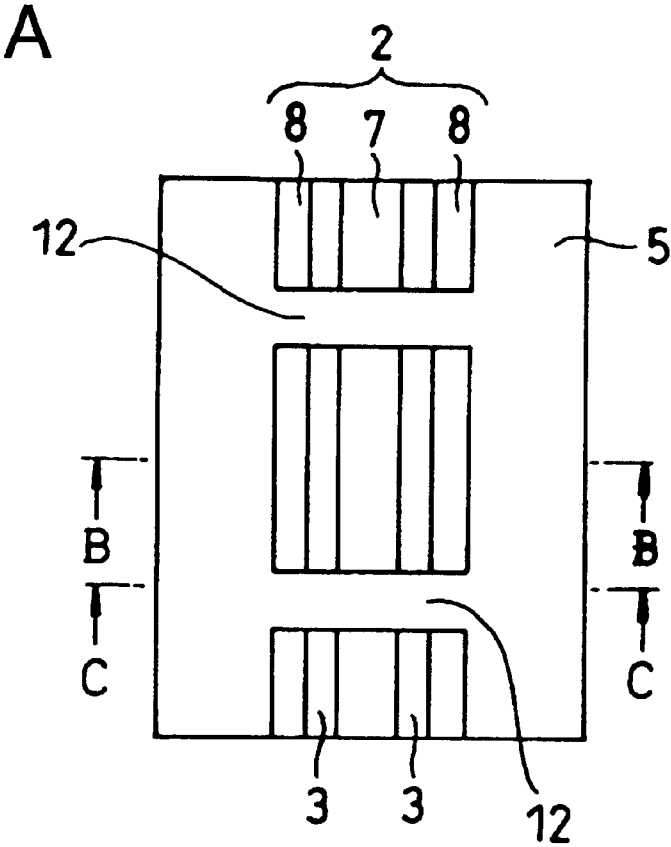
FIG. 12A is a diagrammatic plan view of a twelfth embodiment of the multi-layer substrate in accordance with the present invention.
Figure 12B:
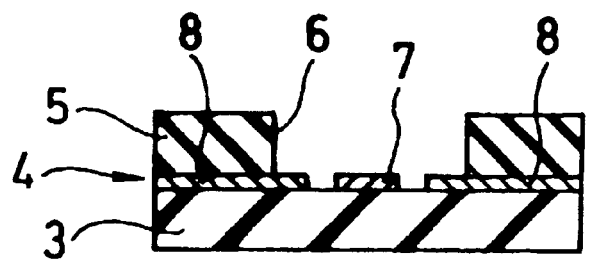
FIG. 12B is a diagrammatic sectional view taken along the line B—B in FIG. 12A.
Figure 12C:
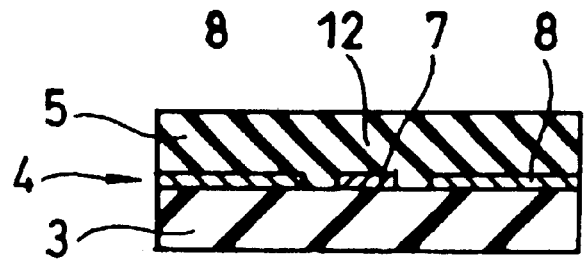
FIG. 12C is a diagrammatic sectional view taken along the line C—C in FIG. 12A.

Referring to FIG. 12A, there is shown a diagrammatic plan view of a twelfth embodiment of the multi-layer substrate in accordance with the present invention. FIG. 12B is a diagrammatic sectional view taken along the line B—B in FIG. 12A, and FIG. 12C is a diagrammatic sectional view taken along the line C—C in FIG. 12A. In FIGS. 12A, 12B and 12C, elements corresponding to those shown in FIGS. 1A and 1B are given the same reference numbers and explanation will be omitted.

In this twelfth embodiment, a plurality of feed-throughs 12 are formed each in the form of a bridge bridging between a pair of second dielectric layer portions 5 which are positioned on a pair of ground conductor layers 8, respectively. In other words, a plurality of feed-throughs 12 are formed in the opening 6 in the first embodiment. The feed-throughs 12 are formed of the same material as that of the second dielectric layer 5.

In this structure of the twelfth embodiment, since the coplanar waveguide line 2 is surrounded by a side wall of the opening 6 and the feed-throughs 12, if the coplanar waveguide line 2 surrounded by a side wall of the opening 6 and the feed-throughs 12 is covered with a lid (not shown), it is possible to realize an air-tight magnetic shield.

It would be a matter of course to persons skilled in the art that this structure of the twelfth embodiment applied to the first embodiment as mentioned above, can be similarly applied to the second to eleventh embodiments.

Thirteenth Embodiment

Figure 13A:
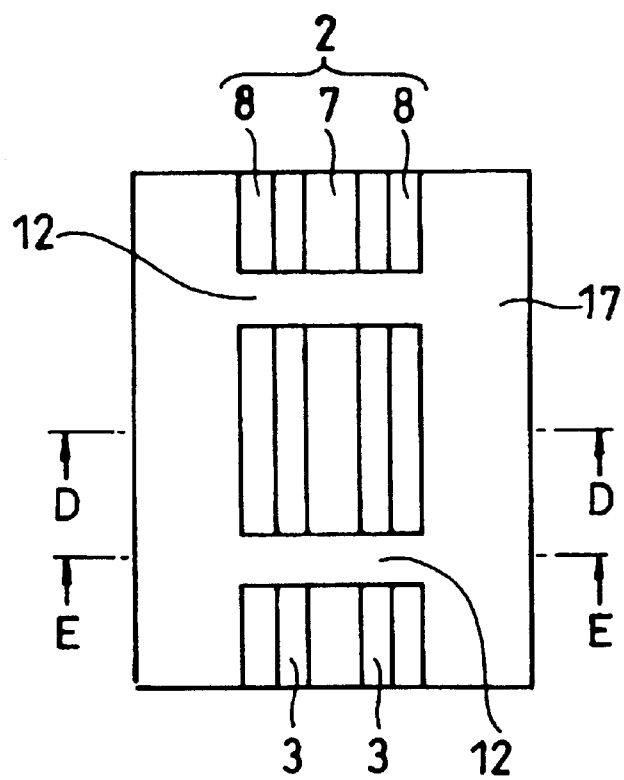
FIG. 13A is a diagrammatic plan view of a thirteenth embodiment of the multi-layer substrate in accordance with the present invention.
Figure 13B:
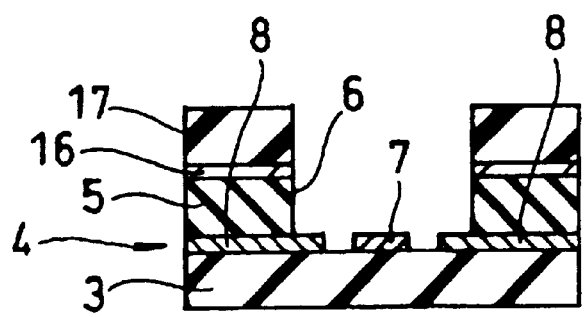
FIG. 13B is a diagrammatic sectional view taken along the line D—D in FIG. 13A.
Figure 13C:
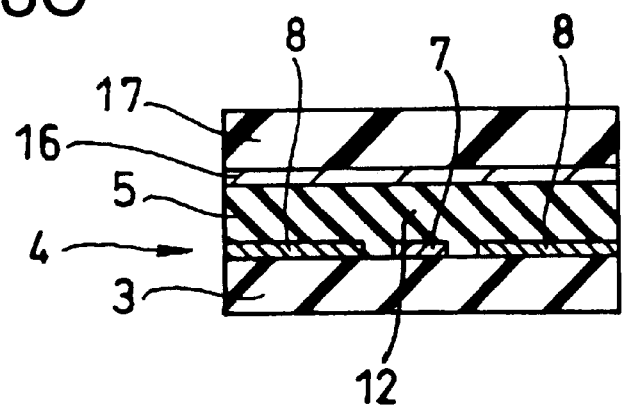
FIG. 13C is a diagrammatic sectional view taken along the line E—E in FIG. 13A.

Referring to FIG. 13A, there is shown a diagrammatic plan view of a thirteenth embodiment of the multi-layer substrate in accordance with the present invention. FIG. 13B is a diagrammatic sectional view taken along the line D—D in FIG. 13A, and FIG. 13C is a diagrammatic sectional view taken along the line E—E in FIG. 13A. In FIGS. 13A, 13B and 13C, elements corresponding to those shown in FIGS. 12A, 12B and 12C are given the same reference numbers and explanation will be omitted.

In this thirteenth embodiment, a second conductive layer 16 and a t third dielectric layer 17 are formed in the named order on the second dielectric layer 5 including the feed-throughs 12.

In this structure, a wiring conductor (such as a signal line or a biasing line) which traverses the coplanar waveguide line 2, can be formed by utilizing the second conductive layer 16 on the feed-through 12.

The multi-layer substrate 1 of this thirteenth embodiment can be easily formed by laminating a ceramic substrate having one surface printed with a conductor paste (which becomes the patterned conductor layer 4) and a plurality of ceramic substrates each having a plurality of apertures corresponding to the opening 6 divided by the feed-throughs 12 and each having one surface printed with a conductor paste (which becomes the conductor layer 16), and sintering the integrally laminated ceramic substrates.

In this structure, the number of layers formed on the region excluding a region directly above the coplanar waveguide line 2 is not limited at all. On the other hand, a signal line or a biasing line which traverses the coplanar waveguide line 2, can be formed on the feed-through 12, as mentioned above. As a result, a high density wiring can be realized.

Fourteenth Embodiment

Figure 14A:
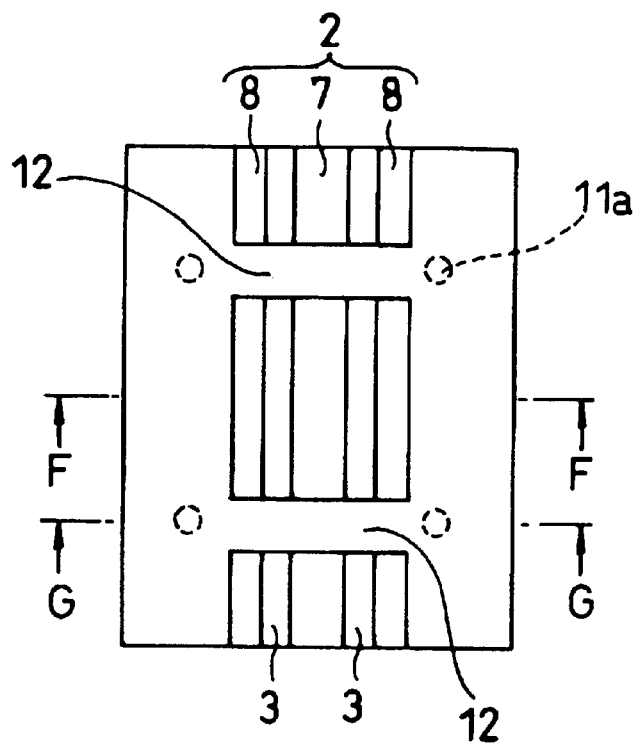
FIG. 14A is a diagrammatic plan view of a fourteenth embodiment of the multi-layer substrate in accordance with the present invention.
Figure 14B:
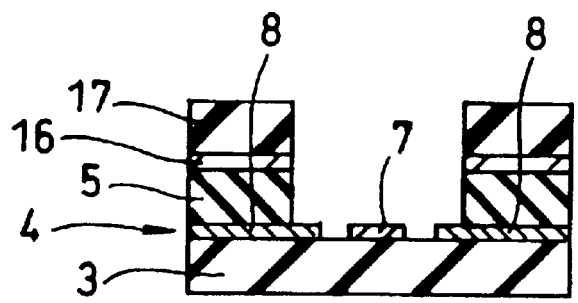
FIG. 14B is a diagrammatic sectional view taken along the line F—F in FIG. 14A.
Figure 14C:
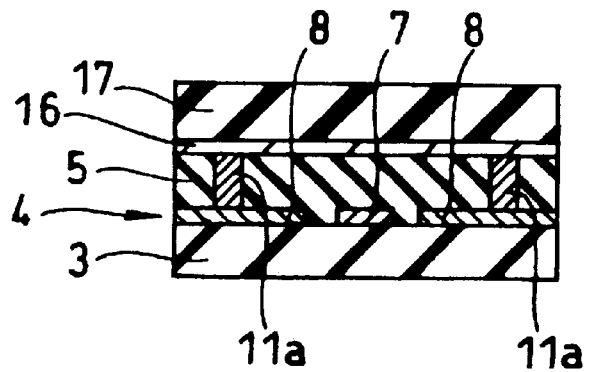
FIG. 14C is a diagrammatic sectional view taken along the line G—G in FIG. 14A.

Referring to FIG. 14A, there is shown a diagrammatic plan view of a fourteenth embodiment of the multi-layer substrate in accordance with the present invention. FIG. 14B is a diagrammatic sectional view taken along the line F—F in FIG. 14A, and FIG. 14C is a diagrammatic sectional view taken along the line G—G in FIG. 14A. In FIGS. 14A, 14B and 14C, elements corresponding to those shown in FIGS. 13A, 13B and 13C are given the same reference numbers and explanation will be omitted.

In this fourteenth embodiment, a plurality of via contacts 11*a* for interconnecting between the ground conductor layer 8 and the second conductor layer 16 are buried in the second dielectric layer 5 in the proximity of the feed-through 12, to extend so as to penetrate through the second dielectric layer 5.

In this structure of the fourteenth embodiment, a pair of the ground conductors 8 located at opposite sides of the signal conductor 7 are interconnected through the second conductor layer 16 formed on the feed-throughs 12. In general, it is widely known in the coplanar waveguide that at a branch or bend, the pair of the ground conductors 8 located at opposite sides of the signal conductor 7 are required to be maintained at the same potential. This is realized in this embodiment.

Fifteenth Embodiment

Figure 15:
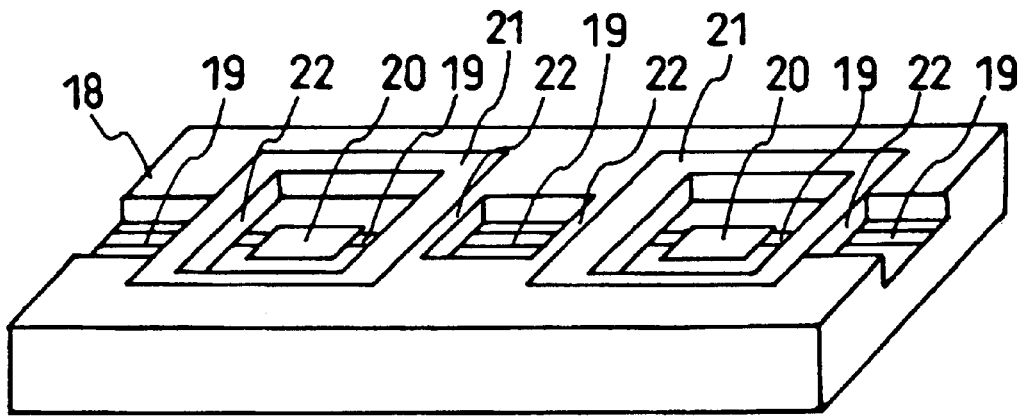
FIG. 15 is a diagrammatic perspective view of a fifteenth embodiment of the multi-layer substrate in accordance with the present invention.

FIG. 15 is a diagrammatic perspective view of a fifteenth embodiment of the multi-layer substrate in accordance with the present invention, in which a plurality of semiconductor devices are mounted on the multi-layer substrate.

In FIG. 15, the multi-layer substrate is designated with the reference number 18, and a coplanar waveguide line 19 is formed on the multilayer substrate 18, similarly to the first embodiment. A plurality of semiconductor devices 20 are mounted on the multi-layer substrate 18 and connected to the coplanar waveguide line 19. A plurality of feed-throughs 22 are formed each to bridge between a pair of second dielectric layer portions which are positioned on a pair of ground conductor layers of the coplanar waveguide line 19, respectively. Furthermore, a sealing region 21 of for example gold or tin is formed on a surface of an uppermost dielectric layer by use of a sputtering, so that a lid (not shown) can be mounted on and bonded to the sealing region 21.

In this structure of the fifteenth embodiment, the coplanar waveguide line sufficiently suppressing the leakage of the signal transmission can be easily realized in the multi-layer high frequency circuit substrate 18. On the other hand, the whole of the multi-layer high frequency circuit substrate 1 has a sufficient mechanical strength. An airtight magnetic shield can be easily ensured for the coplanar waveguide line 19 and the semiconductor devices 20 by bonding a lid to the sealing region 21.

It would be a matter of course to persons skilled in the art that this structure of the fifteenth embodiment applied to the first embodiment as mentioned above, can be similarly applied to the second to fourteenth embodiments. In the fifteenth embodiment, the coplanar waveguide line 19 is connected to the semiconductor devices 20, but can be connected to a passive circuit elements such as a filter.

Sixteenth Embodiment

Figure 16:
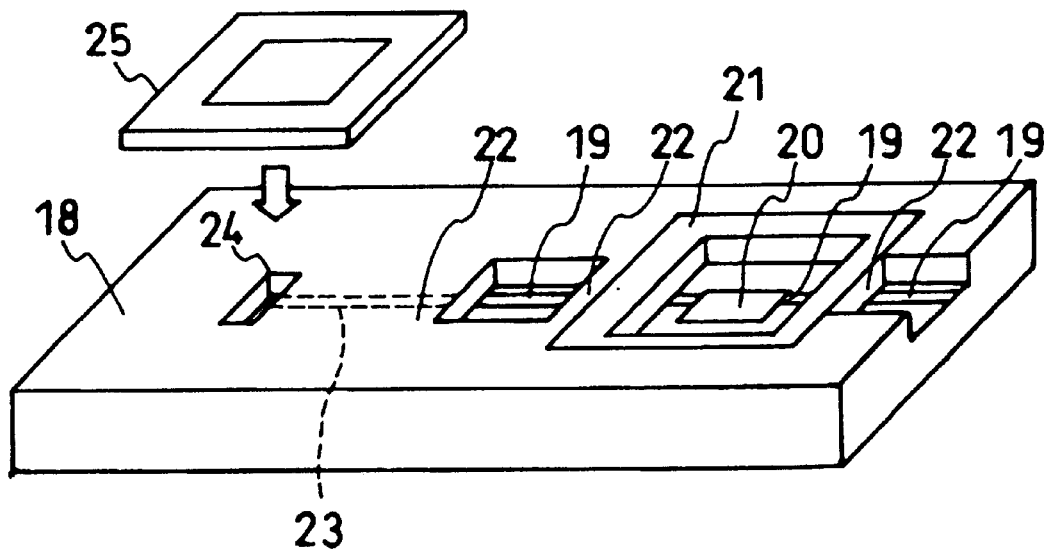
FIG. 16 is a diagrammatic perspective view of a sixteenth embodiment of the multi-layer substrate in accordance with the present invention.

FIG. 16 is a diagrammatic perspective view of a sixteenth embodiment of the multi-layer substrate in accordance with the present invention. In FIG. 16, elements corresponding to those shown in FIG. 15 are given the same reference numbers and explanation will be omitted.

In the sixteenth embodiment, a waveguide connecting port 24, which can be connected with a feed line and a patch antenna, is formed in the multi-layer substrate to reach the coplanar waveguide line 19, and a feed line 23 is formed to extend from the waveguide connecting port 24 to the semiconductor device 20.

In this structure of the sixteenth embodiment, a patch antenna 25 is connected through the waveguide connecting port 24 and the feed line 23 to the semiconductor device 20. In this connection, a transmission loss is extremely low.

Seventeenth Embodiment

Figure 17:
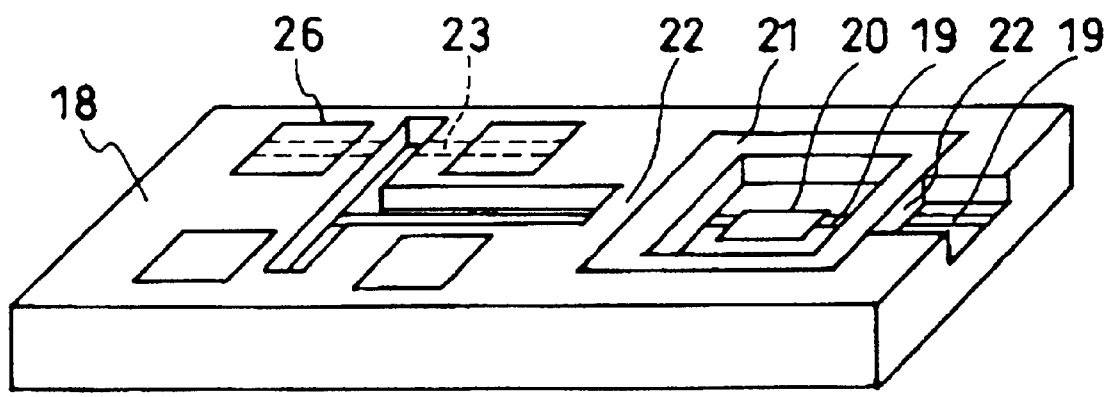
FIG. 17 is a diagrammatic perspective view of a seventeenth embodiment of the multi-layer substrate in accordance with the present invention.
Figure 18A:
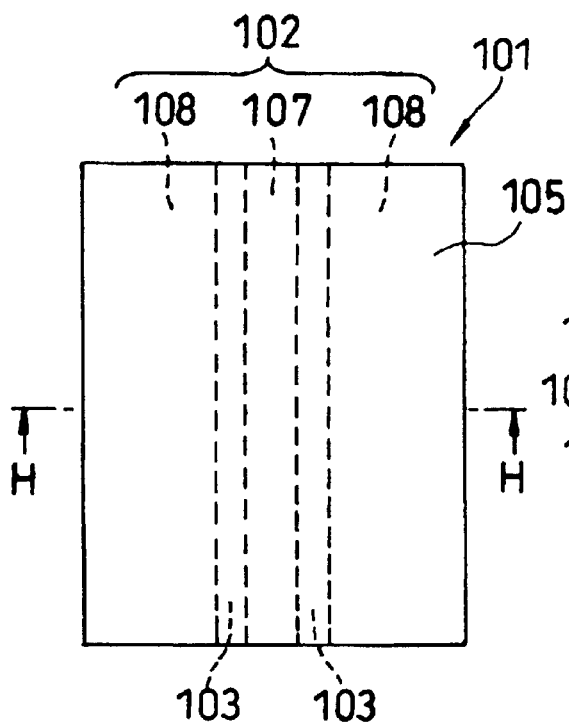
FIG. 18A is a diagrammatic plan view of a prior art multi-layer substrate in which the coplanar waveguide line is formed.
Figure 18B:
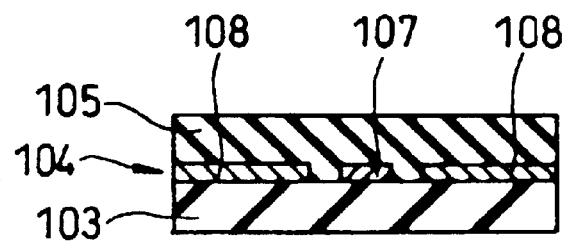
FIG. 18B is a sectional view taken along the line H—H in FIG. 18A.

FIG. 17 is a diagrammatic perspective view of a seventeenth embodiment of the multi-layer substrate in accordance with the present invention, in which a patch is directly formed on the multi-layer substrate. In FIG. 17, elements corresponding to-those shown in FIG. 16 are given the same reference numbers and explanation will be omitted.

A patch 26 is formed on a surface of an uppermost dielectric layer. The semiconductor device 20 is connected through the feed line 23 to the patch 26.

In this structure of the seventeenth embodiment, since the patch 26 is formed on the surface of the multi-layer substrate, the semiconductor device 20 and the patch 26 are interconnected with a low loss.

As seen from the above explanation, in the multi-layer substrate in accordance with the present invention, since the second dielectric layer formed on the first dielectric layer has the opening or the groove positioned in the region in conformity with the signal conductor of the coplanar waveguide line, an unwanted propagation mode including the surface wave mode is suppressed. On the other hand, since the thickness of the whole is not limited, a satisfactory mechanical strength can be ensured. In addition, the multi-layer substrate in accordance with the present invention can be easily fabricated by laminating green sheets.

Furthermore, in the case that the dielectric material having the dielectric constant lower than that of the second dielectric layer is filled in the groove, the mechanical strength can be further elevated.

In addition, in the multi-layer substrate in accordance with the present invention, a plurality of feed-throughs are formed each to bridge between a pair of second dielectric layer portions which are positioned on a pair of ground conductor layers of the coplanar waveguide line, respectively. In this case, an air-tight magnetic shield can be easily ensured for the coplanar waveguide line and the semiconductor devices connected thereto, by utilizing the feed-throughs and the groove or opening.

The invention has thus been shown and described with reference to the specific embodiments. However, it should be noted that the present invention is in no way limited to the details of the illustrated structures but changes and modifications may be made within the scope of the appended claims.

What is claimed is:

1. A multi-layer substrate comprising a first dielectric layer, a coplanar waveguide line formed on a first surface of said first dielectric layer, and a second dielectric layer formed on said first dielectric layer and having an opening positioned at least on a signal conductor of said coplanar waveguide line,
wherein a thickness of said first dielectric layer is smaller than the value of $c/\{4f \cdot (\in_1 -1)^{1/2}\}$, where c is velocity of light, f is a frequency of a signal propagating in said coplanar waveguide line, and $\in_1$ is a dielectric constant of said first dielectric layer.

2. A multi-layer substrate claimed in claim 1, further including a back ground conductor layer formed on a second surface of said first dielectric layer.

3. A multi-layer substrate claimed in claim 2, further including a feed-through formed to bridge between a pair of second dielectric layer portions, which are positioned on a pair of ground conductors of said coplanar waveguide line, respectively.

4. A multi-layer substrate claimed in claim 1, further including a feed-through formed to bridge between a pair of second dielectric layer portions, which are positioned on a pair of ground conductors of said coplanar waveguide line, respectively.

5. A multi-layer substrate claimed in claim 2, further including a via contact buried in said first dielectric layer to connect between said back ground conductor layer and a ground conductor of said coplanar waveguide line.

6. A multi-layer substrate comprising a first dielectric layer, a coplanar waveguide line formed on a first surface of said first dielectric layer, and a second dielectric layer formed on said first dielectric layer and having an opening positioned at least on a signal conductor of said coplanar waveguide line,
wherein said first dielectric layer has a dielectric constant smaller than that of said second dielectric layer.

7. A multi-layer substrate claimed in claim 6, further including a back ground conductor layer formed on a second surface of said first dielectric layer.

8. A multi-layer substrate claimed in claim 6, further including a conductor layer formed on said second dielectric layer.

9. A multi-layer substrate comprising a first dielectric layer, a coplanar waveguide line formed on a first surface of said first dielectric layer, and a second dielectric layer formed on said first dielectric layer and having an opening positioned at least on a signal conductor of said coplanar waveguide line,
wherein said first dielectric layer has a dielectric constant smaller than that of said second dielectric layer,
further including a conductor layer formed on said second dielectric layer,
further including a feed-through formed to bridge between a pair of second dielectric layer portions, which are positioned on a pair of ground conductors of said coplanar waveguide line, respectively.

10. A multi-layer substrate claimed in claim 9, wherein said conductor layer extends onto said feed-through.

11. A multi-layer substrate claimed in claim 10, further including a connecting means for connecting said conductor layer and said pair of ground conductors of said coplanar waveguide line.

12. A multi-layer substrate claimed in claim 9 wherein a thickness of said first dielectric layer is smaller than the value of $c/\{4f \cdot (\in_1 -1)^{1/2}\}$, where c is velocity of light, f is a frequency of a signal propagating in said coplanar waveguide line, and $\in_1$ is a dielectric constant of said first dielectric layer.

13. A multi-layer substrate comprising a first dielectric layer, a coplanar waveguide line formed on a first surface of said first dielectric layer, and a second dielectric layer formed on said first dielectric layer and having an groove positioned in a region at least in conformity with a signal conductor of said coplanar waveguide line,
wherein a thickness of said second dielectric layer between a bottom of said groove and said first dielectric layer is smaller than the value of $c/\{4f \cdot (\in_2 -1)^{1/2}\}$, where c is velocity of light, f is a frequency of a signal propagating in said coplanar waveguide line, and $\in_2$ is a dielectric constant of said second dielectric layer.

14. A multi-layer substrate claimed in claim 13, wherein a thickness of said first dielectric layer is smaller than the value of $c/\{4f \cdot (\in_1 -1)^{1/2}\}$, where c is velocity of light, f is a frequency of a signal propagating in said coplanar waveguide line, and $\in_1$ is a dielectric constant of said first dielectric layer.

15. A multi-layer substrate claimed in claim 13, further including a dielectric material filled in said groove and having a dielectric constant lower than that of said second dielectric layer.

16. A multi-layer substrate claimed in claim 13, further including a second groove formed on a second surface of said first dielectric layer, in a region at least in conformity with said signal conductor of said coplanar waveguide line.

17. A multi-layer substrate claimed in claim 16, wherein a thickness of said first dielectric layer between a bottom of said second groove and said signal conductor is smaller than the value of $c/\{4f \cdot (\in_1 -1)^{1/2}\}$, where c is velocity of light f is a frequency of a signal propagating in said coplanar waveguide line, and $\in_1$ is a dielectric constant of said first dielectric layer.

18. A multi-layer substrate claimed in claim 17, further including a second dielectric material filled in said second groove and having a dielectric constant lower than that of said first dielectric layer.

19. A multi-layer substrate comprising a first dielectric layer, a coplanar waveguide line formed on a first surface of said first dielectric layer, and a second dielectric layer formed on said first dielectric layer and having an groove positioned in a region at least in conformity with a signal conductor of said coplanar waveguide line,
further including a back ground conductor layer formed on a second surface of said first dielectric layer.

20. A multi-layer substrate comprising a first dielectric layer, a coplanar waveguide line formed on a first surface of said first dielectric layer, and a second dielectric layer formed on said first dielectric layer and having an groove positioned in a region at least in conformity with a signal conductor of said coplanar waveguide line, further including a back ground conductor layer formed on a second surface of said first dielectric layer, further including a via contact buried in said first dielectric layer to connect between said back ground conductor layer and ground conductor of said coplanar waveguide line.

21. A multi-layer substrate comprising a first dielectric layer, a coplanar waveguide line formed on a first surface of said first dielectric layer, and a second dielectric layer formed on said first dielectric layer and having an groove positioned in a region at least in conformity with a signal conductor of said coplanar waveguide line, wherein said first dielectric layer has a dielectric constant smaller than that of said second dielectric layer.

22. A multi-layer substrate claimed in claim 21, further including a conductor layer formed on said second dielectric layer.

23. A multi-layer substrate comprising a first dielectric layer, a coplanar waveguide line formed on a first surface of said first dielectric layer, and a second dielectric layer formed on said first dielectric layer and having an groove positioned in a region at least in conformity with a signal conductor of said coplanar waveguide line, wherein said first dielectric layer has a dielectric constant smaller than that of said second dielectric layer, further including a conductor layer formed on said second dielectric layer, further including a feed-through formed to bridge between a pair of second dielectric layer portions, which are positioned on a pair of ground conductors of said coplanar waveguide line, respectively.

24. A multi-layer substrate claimed in claim 23, wherein said conductor layer extends onto said feed-through.

25. A multi-layer substrate claimed in claim 24, further including a connecting means for connecting said conductor layer and said pair of ground conductors of said coplanar waveguide line.

* * * * *